United States Patent [19]

Duerr et al.

[11] Patent Number: 4,841,249
[45] Date of Patent: Jun. 20, 1989

[54] TRUNCATED CONE SHAPED SURFACE RESONATOR FOR NUCLEAR MAGNETIC RESONANCE TOMOGRAPHY

[75] Inventors: Wilhelm Duerr, Erlangen; Hartwig Ingwersen, Uttenreuth; Norbert Krause, Heroldsbach; Ralph Oppelt, Uttenreuth, all of Fed. Rep. of Germany

[73] Assignee: Siemens Aktiengesellschaft, Berlin and Munich, Fed. Rep. of Germany

[21] Appl. No.: 105,003

[22] Filed: Oct. 6, 1987

[30] Foreign Application Priority Data

Oct. 28, 1986 [DE] Fed. Rep. of Germany ....... 3636660

[51] Int. Cl.⁴ ............................................. H01P 7/00
[52] U.S. Cl. ................................... 324/318; 324/322; 333/219
[58] Field of Search ........................... 333/219–223, 333/235; 324/322, 318

[56] References Cited

U.S. PATENT DOCUMENTS

| | | | |
|---|---|---|---|
| 1,962,565 | 6/1934 | Lakhovsky | 333/220 X |
| 2,656,483 | 10/1953 | Apstein | 333/219 X |
| 2,659,002 | 11/1953 | Keeler | 333/33 X |
| 4,435,680 | 3/1984 | Froncisz et al. | 324/316 |
| 4,446,429 | 5/1984 | Froncisz et al. | 324/316 |
| 4,727,327 | 2/1988 | Toyoshima et al. | 324/318 X |
| 4,734,647 | 3/1988 | Yoshimura | 333/230 X |

FOREIGN PATENT DOCUMENTS 0135326 3/1985 European Pat. Off. .
0160942 11/1985 European Pat. Off. .

OTHER PUBLICATIONS

"The Importance of RF-Coils for the Magnetic Resonance Tomography," Roeschmann et al., Biomedizinische Technik, vol. 31, No. 7-8, 1986, pp. 178-185.
"Planar-Pair Local Coils for High-Resolution Magnetic Resonance Imaging, Particularly of the Temporomandibular Joint," Hyde et al., Med. Phys., vol. 13(1), Jan./Feb. 1986, pp. 1-7.
"Resonators for in vivo $^{31}$P NMR at 1.5T," Grist et al., J. Mag. Res. 61, (1985), pp. 571, 578.

Primary Examiner—Eugene R. LaRoche
Assistant Examiner—Benny Lee

[57] ABSTRACT

A surface resonator for use in nuclear magnetic resonance tomography is a single turn loop of ribbon-like electrical conductor having spaced ends facing each other which form a capacitor whose capacitance determines the resonant frequency. The loop of ribbon-like conductor is shaped to conform substantially to the generated surface of a truncated cone. The ends of the loop may be in the form of spaced plates for providing the necessary capacitance, or may be connected by one or more discrete component capacitors.

3 Claims, 1 Drawing Sheet

TRUNCATED CONE SHAPED SURFACE RESONATOR FOR NUCLEAR MAGNETIC RESONANCE TOMOGRAPHY

BACKGROUND OF THE INVENTION

1. Field of the Invention

The present invention is directed to a surface resonator of the type suitable for use in nuclear magnetic resonance tomography, and in particular to a surface resonator in the form of a single loop of ribbon-like electrical conductor, wherein the capacitance between the ends of the conductor determines the resonant frequency.

2. Description of the Prior Art

It is known that hydrogen atom nuclei of an examination subject, i.e., protons bonded in water molecules, can be caused to precess from an equilibrium orientation or direction which is imposed on the nuclei by a fundamental magnetic field having a high static field strength. Precession of the nuclei is caused by radio-frequency excitation pulses. At the end of an excitation pulse, the atomic nuclei precess at a frequency dependent on the strength of the fundamental magnetic field and, after a predetermined relaxation time, return to the equilibrium direction as a consequence of their spin. An image can be produced by analysis of the signals generated by the precessing protons, the image being produced based on the spatial spin density or based on the distribution of the relaxation times within a body slice. The origin of the nuclear magnetic resonance signal arising from the precessional motion is identified by applying linear field gradients. These gradient fields are superimposed on the fundamental field, and are controlled such that only protons in a slice of the examination subject of interest are excited. The generation of images in this manner is generally referred to as nuclear magnetic resonance (NMR) tomography, or magnetic resonance imaging (MRI).

As is known, surface coils are used for obtaining images of certain body regions having a relatively small expanse, such surface coils generally being in the form of a flat coil with a plurality of turns. The surface coil is simply laid on the body part for which an image is to be generated, for example a vertebra, the middle ear, or on an eye. One embodiment of such a surface coil is referred to as a "loop-gap" resonator. This coil consists of a single turn of a ribbon-shaped metallic conductor having free tab or plate shaped ends which form a capacitor. The conductor is usually applied as a surface layer to a carrier of electrically insulating material, which may be a plastic such as polymethylacrylate. The capacitance can be varied by changing the spacing and size of the plate-shaped ends, as well as by selection of a dielectric. The capacitance can thus be brought into resonance with the inductance of the conductor, which may be a hollow cylinder. The energy can be inductively coupled into the coil via a coupling loop. Such a resonator is described in the Journal of Magnetic Resonance, Vol. 61, pages 571–578 (1985).

A microwave resonator in the form of a split-ring resonator wherein the conductor is ribbon-shaped is described in U.S. Pat. No. 4,446,429. This resonator, also in the form of a cylinder consisting of one turn or loop, is provided with at least one axial slot. The capacitance of the free ends disposed opposite each other again determines the resonant frequency.

The body region for which an image is generated using resonators of the type described above is determined by the circular cross-sectional area of the resonator. Because of the axial symmetry of such conventional resonators, the body region for which the image is generated is always of the same size, regardless whether the top or bottom surface of the resonator (defined by the edge of the conductor loop) faces toward the body surface. For obtaining images of regions which differ in size, different surface resonators having correspondingly different cross-sectional areas are needed.

SUMMARY OF THE INVENTION

It is an object of the present invention to provide a surface coil for use in nuclear magnetic resonance tomography which permits respective images of body regions of different size to be obtained using a single coil.

It is a further object of the present invention to provide such a coil having a high load quality.

The above objects are achieved in a surface coil consisting of a ribbon-shaped electrical conductor formed into a single turn of loop with the ends thereof being spaced so as to form a gap. The conductor is arranged to conform substantially to the surface of a truncated cone. Because the bottom and top areas of the truncated cone differ in size, respective images of two subject regions differing in size can be obtained using the same resonator, depending upon whether the top or the bottom surface of the resonator faces toward the patient.

DESCRIPTION OF THE PREFERRED EMBODIMENTS

Figure 1:
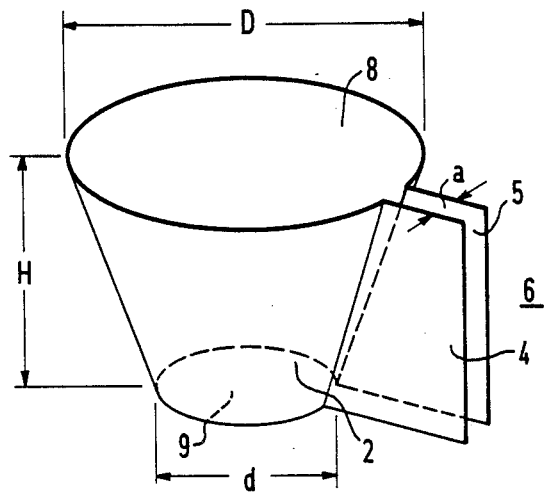
FIG. 1 is a perspective view of a first embodiment of a surface coil constructed in accordance with the principles of the present invention.

In the embodiment shown in FIG. 1, the surface resonator 6 consists of a ribbon-shaped electrical conductor 2 having a single turn and shaped conforming substantially to the surface of a truncated cone. The loop in which the conductor 2 is formed is interrupted by a gap at the ends of the conductor 2 which face each other, the ends facing each other being in the form of plates 4 and 5 which in combination form a capacitor with a plate spacing referred "a". The truncated cone has a height H of, for example, about 8 cm. The top or upper surface 8 enclosed by the upper edge of the conductor 2 has a diameter D of, for example 10 cm, which is significantly larger than the bottom or lower surface 9 enclosed by the lower edge of the conductor 2, which has a diameter d of, for example, about 5 cm. Body parts differing in expanse can thus be imaged by nuclear magnetic resonance tomography using this surface resonator.

Figure 2:
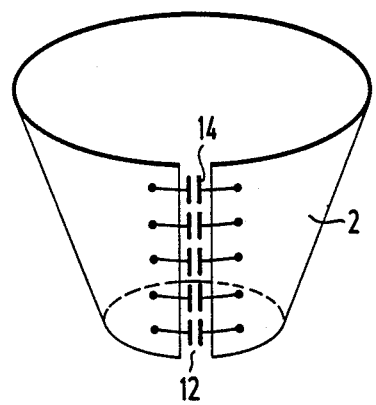
FIG. 2 is a perspective view of a second embodiment of a surface coil constructed in accordance with the principles of the present invention.

In the embodiment of FIG. 2, the ends of the conductor 2, which is also in the shape of a truncated cone, form a slot 12 which is bridged with discrete component capacitors uniformly distributed over the height of the conductor. The leads of the capacitors 14 are secured, for example, to the outside cladding of the conductor 2, such as by soldering, screws, or other suitable fastening means.

Although modifications and changes may be suggested by those skilled in the art it is the intention of the inventors to embody within the patent warranted hereon all changes and modifications as reasonably and properly come within the scope of their contribution to the art.

We claim as our invention:

1. A surface resonator for nuclear magnetic resonance tomography comprising a ribbon-shaped electrical conductor having upper and lower edges arranged in a loop having a gap, said conductor having a shape conforming substantially to the surface of a truncated cone with said upper edge of said conductor surrounding a first area and said lower edge of said conductor surrounding a second area different in size from said first area to permit differently sized areas of a patient to be examined using said surface resonator, and having plate-shaped ends at said gap disposed facing each other and spaced from each other to form a capacitor having a capacitance which determines the resonant frequency of the resonator.

2. A surface resonator for nuclear magnetic resonance tomography comprising:

a ribbon-shaped electrical conductor having upper and lower edges arranged in a loop with spaced ends forming a gap in said loop, said conductor having a shape conforming substantially to the surface of a truncated cone with said upper edge of said conductor surrounding a first area and said lower edge of said conductor surrounding a second area different in size from said first area to permit differently sized areas of a patient to be examined using said surface resonator; and a plurality of discrete component capacitors connected to said spaced ends of said conductor and bridging said gap, said capacitors in combination having a capacitance which determines the resonant frequency of the resonator.

3. A surface resonator for nuclear magnetic resonance tomography comprising:

a ribbon-shaped electrical conductor having upper and lower edges arranged in a loop having spaced ends forming a gap in said loop, said conductor having a shape conforming substantially to the surface of a truncated cone with said upper edge of said conductor surrounding a first area and said lower edge of said conductor surrounding a second area different in size from said first area to permit differently sized areas of a patient to be examined using said surface resonator; and capacitive means electrically connected to said spaced ends of said conductor and having a capacitance for defining the resonant frequency of said resonator.

* * * * *